(12) United States Patent
Kwon et al.

(10) Patent No.: US 12,278,221 B2
(45) Date of Patent: Apr. 15, 2025

(54) DISPLAY DEVICE USING SEMICONDUCTOR LIGHT-EMITTING ELEMENTS, AND MANUFACTURING METHOD THEREFOR

(71) Applicant: LG ELECTRONICS INC., Seoul (KR)

(72) Inventors: Jeonghyo Kwon, Seoul (KR); Soohyun Kim, Seoul (KR); Indo Chung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 417 days.

(21) Appl. No.: 17/780,873

(22) PCT Filed: Dec. 3, 2019

(86) PCT No.: PCT/KR2019/016887
§ 371 (c)(1),
(2) Date: May 27, 2022

(87) PCT Pub. No.: WO2021/107237
PCT Pub. Date: Jun. 3, 2021

(65) Prior Publication Data
US 2023/0005887 A1 Jan. 5, 2023

(30) Foreign Application Priority Data
Nov. 28, 2019 (KR) .................. 10-2019-0156082

(51) Int. Cl.
*H01L 25/075* (2006.01)
*H10H 20/857* (2025.01)
*H10H 20/01* (2025.01)

(52) U.S. Cl.
CPC ....... *H01L 25/0753* (2013.01); *H10H 20/857* (2025.01); *H01L 2224/95101* (2013.01); *H10H 20/0364* (2025.01)

(58) Field of Classification Search
CPC .................................................. H01L 25/0753
See application file for complete search history.

(56) References Cited

U.S. PATENT DOCUMENTS 10,446,752 B2   10/2019 Lin et al.
2022/0352446 A1* 11/2022 Chung .................. H01L 33/005

FOREIGN PATENT DOCUMENTS

KR   10-2017-0104086 A   9/2017
KR   10-2018-0007376 A   1/2018
(Continued)

*Primary Examiner* — Zandra V Smith
*Assistant Examiner* — Molly K Reida
(74) *Attorney, Agent, or Firm* — Birch, Stewart, Kolasch & Birch, LLP

(57) ABSTRACT

Discussed is a display device including a base portion; assembly electrodes that extend in one direction and are disposed on the base portion at predetermined intervals; a dielectric layer deposited on the base portion to cover the assembly electrodes; a first wiring electrode that extends in the same direction as the assembly electrodes and is disposed on the dielectric layer so as not to overlap the assembly electrodes; a partition wall portion deposited on the dielectric layer while arranging cells at predetermined intervals to overlap the assembly electrodes and the first wiring electrode along an extension direction of the assembly electrodes; and semiconductor light-emitting elements seated in the cells, respectively, wherein a solder layer electrically connecting a semiconductor light-emitting element seated in a cell and the first wiring electrode overlapping the cell is filled in the cell from among the plurality of semiconductor light emitting elements and the cells.

15 Claims, 21 Drawing Sheets

(56) References Cited

FOREIGN PATENT DOCUMENTS

| KR | 10-2019-0104277 A | 8/2018 |
| KR | 19-2019-0104276 A | 8/2018 |
| KR | 10-2019-0085892 A | 7/2019 |
| KR | 10-2019-0096474 A | 8/2019 |
| KR | 10-2019-0106885 A | 9/2019 |
| KR | 10-2019-0117413 A | 10/2019 |
| KR | 10-2019-0126260 A | 11/2019 |

\* cited by examiner

DISPLAY DEVICE USING SEMICONDUCTOR LIGHT-EMITTING ELEMENTS, AND MANUFACTURING METHOD THEREFOR

CROSS REFERENCE TO RELATED APPLICATIONS

This application is the National Stage filing under 35 U.S.C. 371 of International Application No. PCT/KR2019/016887, filed on Dec. 3, 2019, which claims the benefit of earlier filing date of and rights of priority to Korean Patent Application No. 10-2019-0156082 filed on Nov. 28, 2019, the contents of all these applications are hereby expressly incorporated by reference into the present application.

TECHNICAL FIELD

The present disclosure relates to a display device using semiconductor light-emitting elements and a manufacturing method therefor, and more particularly, to a display device using semiconductor light-emitting elements having a size of several to tens of micrometers and a manufacturing method therefor.

BACKGROUND ART

In recent years, liquid crystal displays (LCDs), organic light emitting diode (OLED) displays, and micro LED displays have been competed to implement a large-area display in the field of display technology.

However, there exist problems such as not-so-fast response time, low efficiency of light generated by backlight in case of LCDs, and there exist drawbacks such as short life span, not-so-good yield as well as low efficiency in case of OLEDs.

On the contrary, when semiconductor light emitting elements (micro LEDs) having a diameter or a cross sectional area of 100 micrometers or less are used in a display, the display may provide a very high efficiency because it does not absorb light using a polarizing plate or the like. However, since a large-sized display requires millions of semiconductor light-emitting elements, it has difficulty in transferring the devices compared to other technologies.

Technologies currently in development for transfer processes include pick & place, laser lift-off (LLO), self-assembly, or the like. Among them, the self-assembly method, which is a method in which the semiconductor light-emitting element locates themselves in a fluid, is the most advantageous method for realizing a large-sized display device.

On the other hand, the self-assembly method includes a method of directly assembling the semiconductor light-emitting element to a final substrate to be used in a product, and a method of assembling the semiconductor light-emitting element on an assembly substrate and then transferring the semiconductor light-emitting element to the final substrate through an additional transfer process. The direct assembly method on the final substrate is efficient in terms of process, and in the case of using the assembly substrate, there is an advantage in that a structure for self-assembly can be added without limitation, and therefore, the two methods are selectively used.

DISCLOSURE OF INVENTION

Technical Problem

An aspect of the present disclosure is to provide a display device having a structure in which a vertical semiconductor light-emitting element seated in a cell is electrically connected to a lower wiring through a solder layer filling an inside of the cell.

Another aspect of the present disclosure is to provide a method of manufacturing a display device in which a vertical semiconductor light-emitting element is directly seated on a final substrate in a self-assembly method, and then a solder layer filling an inside of a cell is formed and electrically connected to a lower wiring.

Solution to Problem

A display device according to an embodiment of the present disclosure may include a base portion; assembly electrodes that extend in one direction and are disposed on the base portion at predetermined intervals; a dielectric layer deposited on the base portion to cover the assembly electrodes; a first wiring electrode that extends in the same direction as the assembly electrodes and is disposed on the dielectric layer so as not to overlap the assembly electrodes; a partition wall portion deposited on the dielectric layer while arranging cells at predetermined intervals to overlap the assembly electrode and the first wiring electrode along an extension direction of the assembly electrode; and semiconductor light-emitting elements seated in the cell, wherein a solder layer electrically connecting the semiconductor light-emitting element seated in the cell and the first wiring electrode overlapping the cell is filled in the cell.

According to the present embodiment, the semiconductor light-emitting element may include a first conductive electrode; a first conductive semiconductor layer disposed on the first conductive electrode; an active layer disposed on the first conductive semiconductor layer; a second conductive semiconductor layer disposed on the active layer; and a second conductive electrode disposed on the second conductive semiconductor layer, wherein the solder layer electrically connects either one of the first conductive electrode and the second conductive electrode of the semiconductor light-emitting element to the first wiring electrode.

According to the present embodiment, the semiconductor light-emitting element may further include a passivation layer covering at least part of a side surface of the semiconductor light-emitting element.

According to the present embodiment, the assembly electrodes may define a pair of pair electrodes between two adjacent assembly electrodes, wherein the first wiring electrode is disposed between the pair electrodes.

According to the present embodiment, the cell may further include a protruding portion protruding in an extension direction of the first wiring electrode.

According to the present embodiment, the protruding portion may be disposed to have a width equal to or greater than that of the first wiring electrode.

According to the present embodiment, the first wiring electrode may be disposed to protrude from a bottom surface of the cell than the dielectric layer.

According to the present embodiment, the display device may further include a second wiring electrode that extends in a direction crossing the first wiring electrode and is disposed on the partition wall portion, wherein the second wiring electrode is electrically connected to either one of the second conductive electrode and the first conductive electrode of the semiconductor light-emitting element.

A method of manufacturing a display device according to an embodiment of the present disclosure may include arranging assembly electrodes extending in one direction on a base portion at predetermined intervals; placing a dielectric layer on the base portion to cover the assembly electrodes; placing a first wiring electrode extending in the same direction as the assembly electrodes on the dielectric layer; placing a partition wall portion to cover the dielectric layer while arranging cells on the dielectric layer at predetermined intervals so as to overlap the assembly electrode and the first wiring electrode along an extension direction of the assembly electrode; seating a semiconductor light-emitting element in the cell; and placing a solder layer electrically connecting the semiconductor light-emitting element seated in the cell and the first wiring electrode overlapping the cell in the cell.

According to the present embodiment, the solder layer may be disposed in an empty space of the cell in which the semiconductor light-emitting element is seated, wherein the placing a solder layer electrically connecting the semiconductor light-emitting element seated in the cell and the first wiring electrode overlapping the cell in the cell includes depositing a metal having a melting point in a predetermined range on one surface of the partition wall portion on which the cell is disposed; heat-treating the deposited metal to be melted in a predetermined temperature range; placing a mask on an area overlapping the empty space of the cell and then etching the deposited metal; and removing the placed mask.

According to the present embodiment, the method may further include placing a second wiring electrode extending in a direction crossing the first wiring electrode on the partition wall portion.

According to the present embodiment, the seating of the semiconductor light-emitting element in the cell may place the semiconductor light-emitting element in a chamber containing a fluid and then seat the semiconductor light-emitting element in the cell using electric and magnetic fields.

Advantageous Effects of Invention

According to an embodiment of the present disclosure, a lower electrode of a semiconductor light-emitting element and a lower wiring of a substrate may be electrically connected by a solder layer filling into a cell, thereby having an effect capable of assembling a vertical semiconductor light-emitting element to a final substrate by a self-assembly method.

Furthermore, according to an embodiment of the present disclosure, the cell may further include a protruding portion extending in an extension direction of the lower wiring, and the solder layer may also be filled in the protruding portion to expand an area of the lower wiring electrically connected to the semiconductor light-emitting element, thereby supplementing an amount of current supplied to the semiconductor light-emitting element.

MODE FOR THE INVENTION

Figure 1:
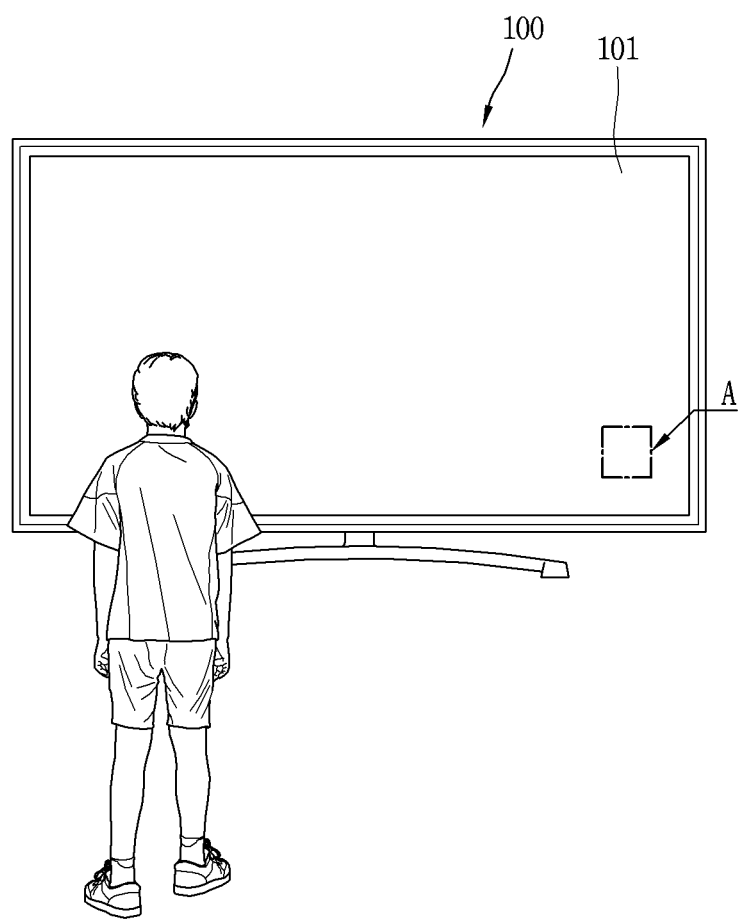
FIG. 1 is a conceptual view illustrating a display device using a semiconductor light-emitting element according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the embodiments disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings. Furthermore, it will be understood that when an element such as a layer, region or substrate is referred to as being "on" another element, it can be directly on the another element or an intermediate element may also be interposed therebetween.

A display device disclosed herein may include a mobile phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, even if a new product type to be developed later includes a display, a configuration according to an embodiment disclosed herein may be applicable thereto.

Figure 2:
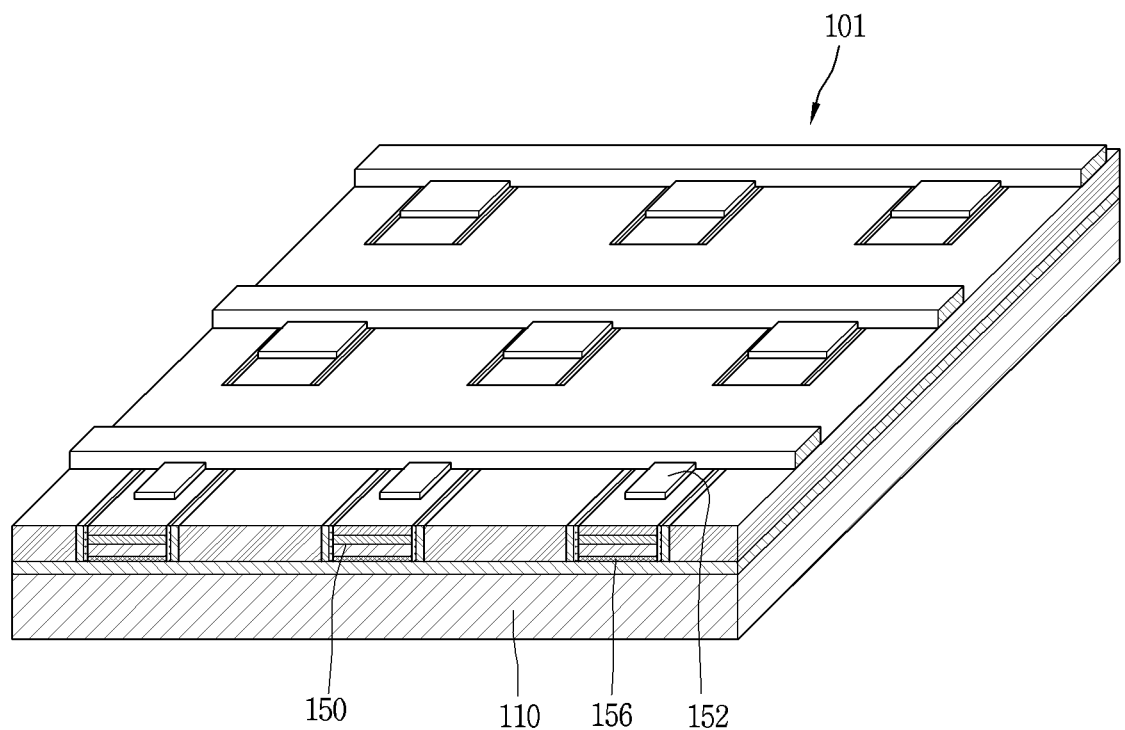
FIG. 2 is a partially enlarged view showing a portion "A" of the display device in FIG. 1.
Figure 3:
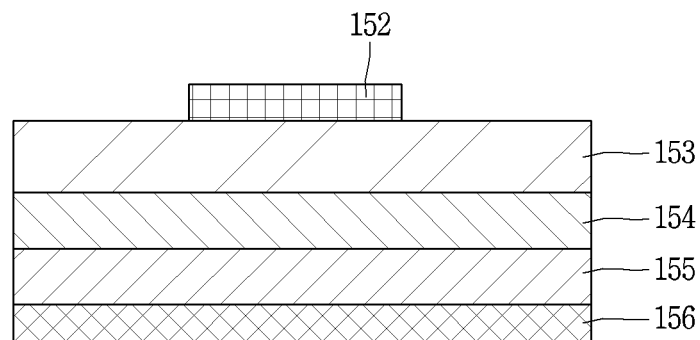
FIG. 3 is an enlarged view showing a semiconductor light-emitting element in FIG. 2.
Figure 4:
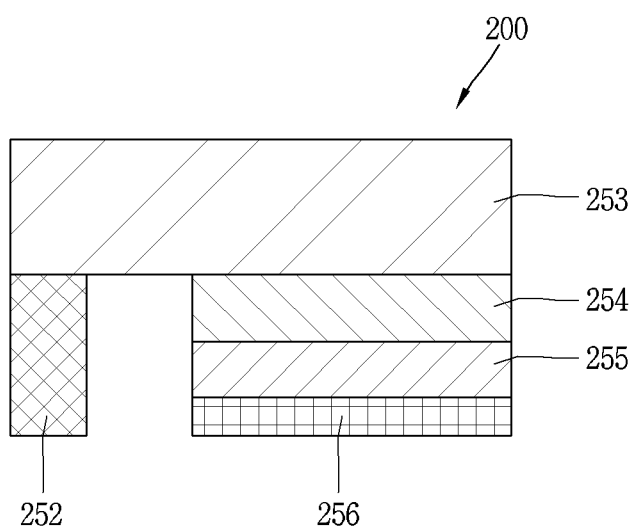
FIG. 4 is an enlarged view showing another embodiment of the semiconductor light-emitting element in FIG. 2.

FIG. 1 is a conceptual view showing a display device using a semiconductor light-emitting element according to an embodiment of the present disclosure, and FIG. 2 is a partially enlarged view showing a portion "A" of the display device in FIG. 1, and FIG. 3 is an enlarged view showing a semiconductor light-emitting element in FIG. 2, and FIG. 4 is an enlarged view showing another embodiment of the semiconductor light-emitting element in FIG. 2.

According to the illustration, information processed in the controller of the display device 100 may be displayed on a display module 140. A case 101 in the form of a closed loop surrounding an edge of the display module may form a bezel of the display device.

The display module 140 may include a panel 141 on which an image is displayed, and the panel 141 may include micro-sized semiconductor light-emitting elements 150 and a wiring substrate 110 on which the semiconductor light-emitting elements 150 are mounted.

Wiring lines may be formed on the wiring substrate 110, and connected to an n-type electrode 152 and a p-type electrode 156 of the semiconductor light-emitting element 150. Through this, the semiconductor light-emitting element 150 may be provided on the wiring substrate 110 as a self-emitting individual pixel.

An image displayed on the panel 141 is visual information, and implemented by independently controlling the light emission of a sub-pixel arranged in a matrix form through the wiring lines.

According to the present disclosure, a micro LED (Light Emitting Diode) is illustrated as one type of the semiconductor light-emitting element 150 that converts current into light. The micro LED may be a light emitting diode formed with a small size of 100 microns or less. The semiconductor light-emitting element 150 may be provided in blue, red, and green light emitting regions, respectively, to implement a sub-pixel by a combination of the light emitting regions. In other words, the sub-pixel denotes a minimum unit for implementing a single color, and at least three micro LEDs may be provided in the sub-pixel.

More specifically, referring to FIG. 3, the semiconductor light-emitting element 150 may be a vertical structure.

For example, the semiconductor light-emitting elements 150 may be implemented with a high-power light emitting device that emits various lights including blue in which gallium nitride (GaN) is mostly used, and indium (In) and or aluminum (Al) are added thereto.

The vertical semiconductor light-emitting element may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 located at the bottom may be electrically connected to a p-electrode of the wiring substrate, and the n-type electrode 152 located at the top may be electrically connected to an n-electrode at an upper side of the semiconductor light-emitting element. The electrodes may be disposed in the upward/downward direction in the vertical semiconductor light-emitting element 150, thereby providing a great advantage capable of reducing the chip size.

For another example, referring to FIG. 4, the semiconductor light-emitting element may be a flip chip type semiconductor light-emitting element.

For such an example, the semiconductor light-emitting element 250 may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 disposed to be separated from the p-type electrode 256 in the horizontal direction on the n-type semiconductor layer 253. In this case, both the p-type electrode 256 and the n-type electrode 252 may be electrically connected to the p-electrode and the n-electrode of the wiring substrate at the bottom of the semiconductor light-emitting element.

The vertical semiconductor light-emitting element and the horizontal semiconductor light-emitting element may be a green semiconductor light-emitting element, a blue semiconductor light-emitting element, or a red semiconductor light-emitting element, respectively. The green semiconductor light-emitting element and the blue semiconductor light-emitting element may be mostly formed of gallium nitride (GaN), and indium (In) and/or aluminum (Al) may be added thereto to implement a high-power light emitting device that emits green or blue light. For such an example, the semiconductor light-emitting element may be a gallium nitride thin-film formed in various layers such as n-Gan, p-Gan, AlGaN, and InGa, and specifically, the p-type semiconductor layer may be p-type GaN, and the n-type semiconductor layer may be N-type GaN. However, in case of the red semiconductor light-emitting element, the p-type semiconductor layer may be p-type GaAs and the n-type semiconductor layer may be n-type GaAs.

In addition, a p-electrode side in the p-type semiconductor layer may be p-type GaN doped with Mg, and an n-electrode side in the n-type semiconductor layer may be n-type GaN doped with Si. In this case, the above-described semiconductor light-emitting elements may be semiconductor light-emitting elements without an active layer.

On the other hand, referring to FIGS. 1 through 4, since the light emitting diode is very small, the display panel may be arranged with self-emitting sub-pixels arranged at fine pitch, thereby implementing a high-quality display device.

In a display device using the semiconductor light-emitting element of the present disclosure described above, a semiconductor light-emitting element grown on a wafer and formed through mesa and isolation is used as an individual pixel. In this case, the micro-sized semiconductor light-emitting element 150 must be transferred to a wafer at a predetermined position on the substrate of the display panel. Pick-and-place is used for the transfer technology, but the success rate is low and a lot of time is required. For another example, there is a technology of transferring a plurality of devices at one time using a stamp or a roll, but the yield is limited and not suitable for a large screen display. The present disclosure proposes a new fabrication method of a display device capable of solving the foregoing problems and a fabrication device using the same.

For this purpose, first, a new fabrication method of the display device will be described. FIGS. 5A to 5E are conceptual views for explaining a new process of manufacturing the foregoing semiconductor light-emitting element.

In this specification, a display device using a passive matrix (PM) semiconductor light-emitting element is illustrated. However, an example described below may also be applicable to an active-matrix (AM) type semiconductor light-emitting element. In addition, a method of self-assembling a horizontal semiconductor light-emitting element is illustrated, but it is also applicable to a method of self-assembling a vertical semiconductor light-emitting element.

Figure 5A:
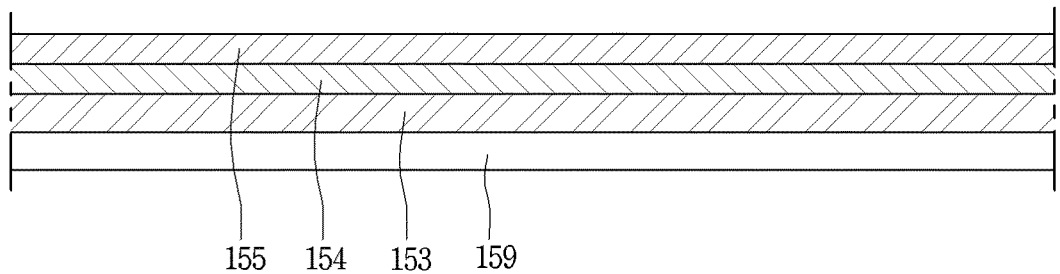
FIGS. 5A to 5E are conceptual views for explaining a new process of manufacturing the foregoing semiconductor light-emitting element.

First, according to a manufacturing method, a first conductive semiconductor layer 153, an active layer 154, and a second conductive semiconductor layer 155 are respectively grown on a growth substrate 159 (FIG. 5A).

When the first conductive semiconductor layer 153 is grown, next, the active layer 154 is grown on the first conductive semiconductor layer 153, and then the second conductive semiconductor layer 155 is grown on the active layer 154. As described above, when the first conductive semiconductor layer 153, the active layer 154 and the second conductive semiconductor layer 155 are sequentially grown, the first conductive semiconductor layer 153, the active layer 154, and the second conductive semiconductor layer 155 form a layer structure as illustrated in FIG. 5A.

In this case, the first conductive semiconductor layer 153 may be a p-type semiconductor layer, and the second conductive semiconductor layer 155 may be an n-type semiconductor layer. However, the present disclosure is not limited thereto, and the first conductive type may be n-type and the second conductive type may be p-type.

In addition, the present embodiment illustrates a case where the active layer is present, but it is also possible to adopt a structure in which the active layer is not present as described above. For such an example, the p-type semiconductor layer may be p-type GaN doped with Mg, and an n-electrode side in the n-type semiconductor layer may be n-type GaN doped with Si.

The growth substrate 159 (wafer) may be formed of any one of materials having light transmission properties, for example, sapphire ($Al_2O_3$), GaN, ZnO, and AlO, but is not limited thereto. Furthermore, the growth substrate 1059 may be formed of a carrier wafer, which is a material suitable for semiconductor material growth. The growth substrate (W) may be formed of a material having an excellent thermal conductivity, and for example, a SiC substrate having a higher thermal conductivity than a sapphire ($Al_2O_3$) substrate or a SiC substrate including at least one of Si, GaAs, GaP, InP and $Ga_2O_3$ may be used.

Figure 5B:
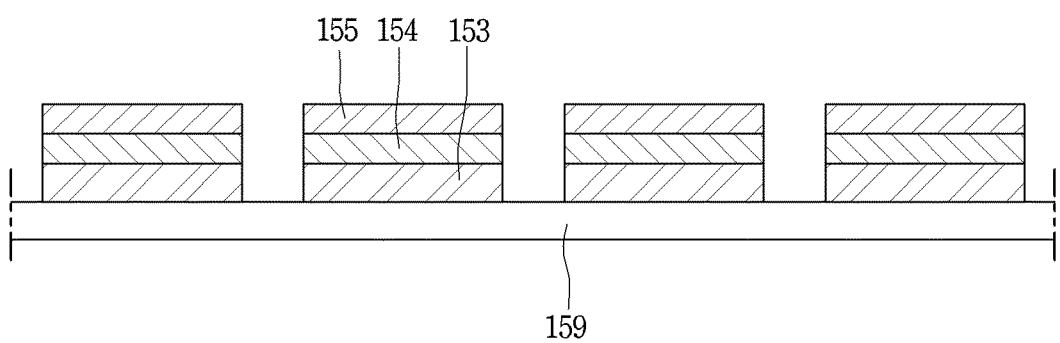

Next, at least part of the first conductive semiconductor layer 153, the active layer 154, and the second conductive semiconductor layer 155 is removed to form a plurality of semiconductor light-emitting elements (FIG. 5B).

More specifically, isolation is performed to allow a plurality of light emitting devices form a light emitting device array. In other words, the first conductive semiconductor layer 153, the active layer 154, and the second conductive semiconductor layer 155 are etched in a vertical direction to form a plurality of semiconductor light-emitting elements.

If it is a case of forming the horizontal semiconductor light-emitting element, then the active layer 154 and the second conductive semiconductor layer 155 may be partially removed in a vertical direction to perform a mesa process in which the first conductive semiconductor layer 153 is exposed to the outside, and then isolation in which the first conductive semiconductor layer is etched to form a plurality of semiconductor light-emitting element arrays.

Figure 5C:
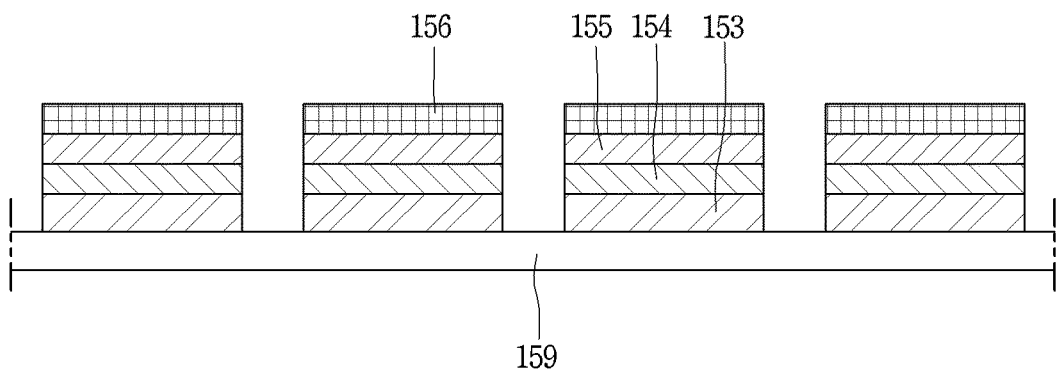

Next, a second conductive electrode 156 (or a p-type electrode) is respectively formed on one surface of the second conductive semiconductor layer 155 (FIG. 5C). The second conductive electrode 156 may be formed by a deposition process such as sputtering, but the present disclosure is not necessarily limited thereto. However, when the first conductive semiconductor layer and the second conductive semiconductor layer are an n-type semiconductor layer and a p-type semiconductor layer, respectively, the second conductive electrode 156 may also be an n-type electrode.

Figure 5D:
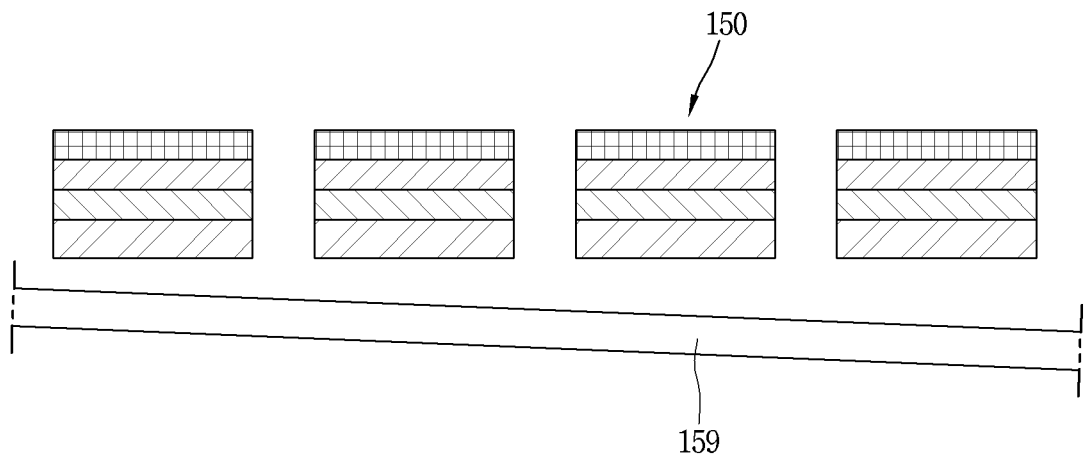

Then, the growth substrate 159 is removed to provide a plurality of semiconductor light-emitting elements. For example, the growth substrate 1059 may be removed using a laser lift-off (LLO) or chemical lift-off (CLO) method (FIG. 5D).

Figure 5E:
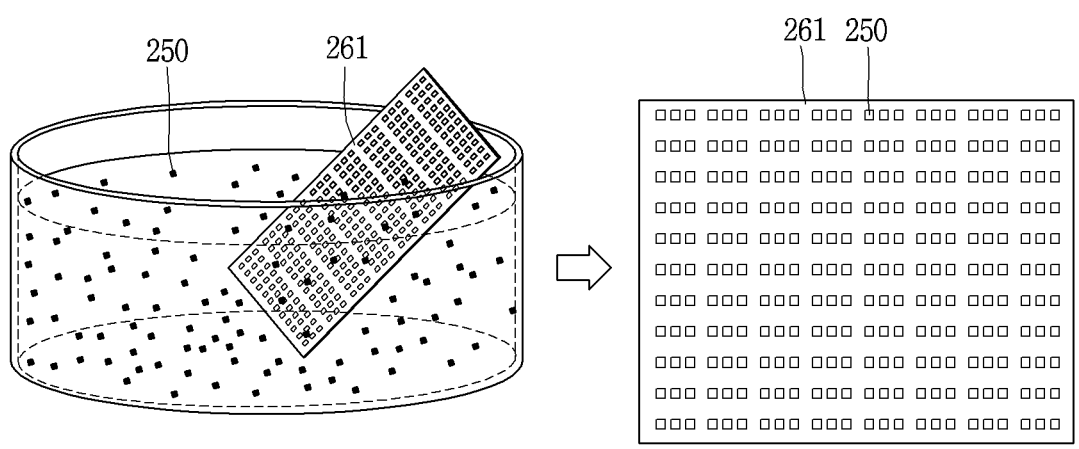

Then, the process of mounting the semiconductor light-emitting elements 150 on the substrate in a chamber filled with a fluid is carried out (FIG. 5E).

For example, the semiconductor light-emitting elements 150 and the substrate are placed into a chamber filled with a fluid, and the semiconductor light-emitting elements are assembled to the substrate 1061 by themselves using flow, gravity, surface tension, or the like. In this case, the substrate may be an assembly substrate 161.

For another example, the wiring substrate may also be placed into the fluid chamber instead of the assembly substrate 161 such that the semiconductor light emitting elements 150 are directly seated on the wiring substrate. In this case, the substrate can be a wiring substrate. However, for convenience of description, in the present disclosure, it is illustrated that the substrate is provided as an assembly substrate 161 and the semiconductor light emitting elements 1050 are seated thereon.

Cells (not shown) into which the semiconductor light-emitting elements 150 are fitted may be provided on the assembly substrate 161 so that the semiconductor light emitting elements 150 are easily seated on the assembly substrate 161. Specifically, cells on which the semiconductor light-emitting elements 150 are seated are formed on the assembly substrate 161 at positions where the semiconductor light-emitting elements 150 are aligned with the wiring electrodes. The semiconductor light-emitting elements 150 are assembled into the cells while moving in the fluid.

When the plurality of semiconductor light-emitting elements are arrayed on the assembly substrate 161, and then the semiconductor light-emitting elements on the assembly substrate 161 are transferred to the wiring substrate, it may enable large-area transfer. Therefore, the assembly substrate 161 may be referred to as a temporary substrate.

Meanwhile, the self-assembly method described above must increase transfer yield when applied to the fabrication of a large-screen display. The present disclosure proposes a method and apparatus for minimizing the influence of gravity or friction and preventing non-specific binding in order to increase the transfer yield.

In this case, in a display device according to the present disclosure, a magnetic body is disposed on the semiconductor light-emitting element to move the semiconductor light-emitting element using a magnetic force, and place the semiconductor light-emitting element at preset position using an electric field in the movement process. Hereinafter, such a transfer method and device will be described in more detail with reference to the accompanying drawings.

Figure 6:
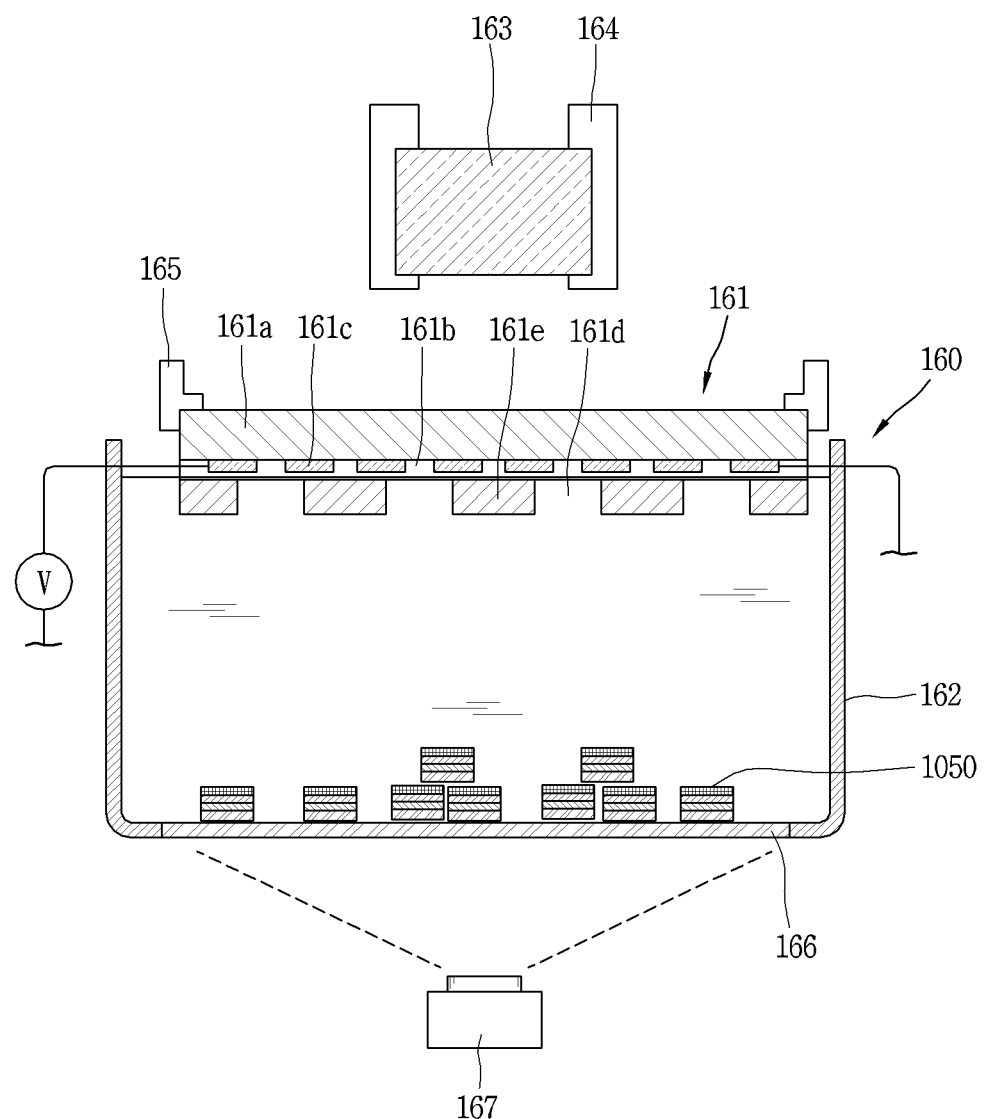
FIG. 6 is a conceptual view showing an example of a self-assembly device of semiconductor light-emitting elements according to the present disclosure.
Figure 7:
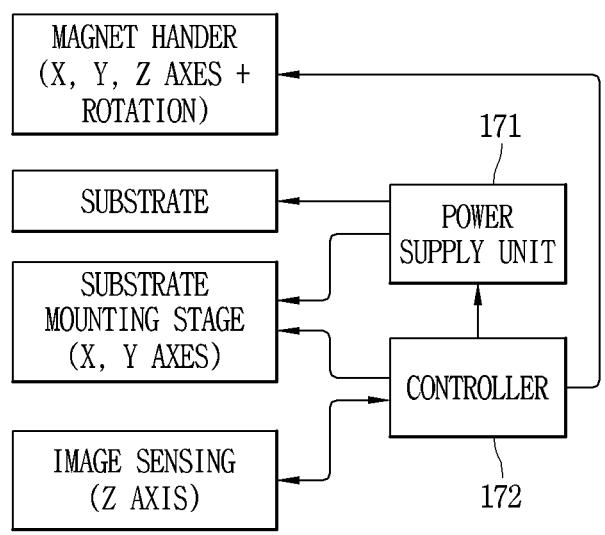
FIG. 7 is a block diagram showing the self-assembly device in FIG. 6.

FIG. 6 is a conceptual view showing an example of a self-assembly device of semiconductor light-emitting elements according to the present disclosure, and FIG. 7 is a block diagram showing the self-assembly device in FIG. 6. FIGS. 8A to 8E are conceptual views showing a process of self-assembling semiconductor light-emitting elements using the self-assembly device in FIG. 6, and FIG. 9 is a conceptual view for explaining the semiconductor light-emitting element in FIGS. 8A to 8E.

According to the illustration of FIGS. 6 and 7, a self-assembly device 160 of the present disclosure may include a fluid chamber 162, a magnet 163, and a location controller 164.

The fluid chamber 162 has a space for accommodating a plurality of semiconductor light-emitting elements. The space may be filled with a fluid, and the fluid may include water or the like as an assembly solution. Accordingly, the fluid chamber 162 may be a water tank, and may be configured with an open type. However, the present disclosure is not limited thereto, and the fluid chamber 162 may be a closed type in which the space is formed with a closed space.

The substrate 161 may be disposed on the fluid chamber 162 such that an assembly surface on which the semiconductor light-emitting elements 150 are assembled faces downward. For example, the substrate 161 may be transferred to an assembly position by a transfer unit, and the transfer unit may include a stage 165 on which the substrate is mounted. The stage 165 is positioned by the controller, and the substrate 161 may be transferred to the assembly position through the stage 165.

At this time, the assembly surface of the substrate 161 faces the bottom of the fluid chamber 150 at the assembly position. According to the illustration, the assembly surface of the substrate 161 is disposed so as to be immersed in a fluid in the fluid chamber 162. Therefore, the semiconductor light-emitting elements 150 are moved to the assembly surface in the fluid.

The substrate 161, which is an assembly substrate on which an electric field can be formed, may include a base portion 161a, a dielectric layer 161b and a plurality of electrodes 161c.

The base portion 161a may be made of an insulating material, and the plurality of electrodes 161c may be a thin or a thick film bi-planar electrode patterned on one side of the base portion 161a. The electrode 161c may be formed of, for example, a stack of Ti/Cu/Ti, an Ag paste, ITO, and the like.

The dielectric layer 161b is made of an inorganic material such as $SiO_2$, $SiN_x$, SiON, $Al_2O_3$, $TiO_2$, $HfO_2$, or the like. Alternatively, the dielectric layer 161b may be composed of a single layer or multiple layers as an organic insulator. A thickness of the dielectric layer 161b may be several tens of nanometers to several micrometers.

Furthermore, the substrate 161 according to the present disclosure includes a plurality of cells 161d partitioned by partition walls. The cells 161d may be sequentially arranged along one direction, and made of a polymer material. In addition, the partition wall 161e constituting the cells 161d is configured to be shared with neighboring cells 161d. The partition walls 161e are protruded from the base portion 161a, and the cells 161d may be sequentially arranged along the one direction by the partition walls 161e. More specifically, the cells 161d are sequentially arranged in row and column directions, and may have a matrix structure.

As shown in the drawing, an inside of the cells 161d has a groove for accommodating the semiconductor light-emitting element 150, and the groove may be a space defined by the partition walls 161e. The shape of the groove may be the same as or similar to that of the semiconductor light-emitting element. For example, when the semiconductor light-emitting element is in a rectangular shape, the groove may be a rectangular shape. In addition, although not shown, when the semiconductor light-emitting element is circular, the grooves formed in the cells may be formed in a circular shape. Moreover, each of the cells is configured to accommodate a single semiconductor light-emitting element. In other words, a single semiconductor light-emitting element is accommodated in a single cell.

Meanwhile, the plurality of electrodes 161c include a plurality of electrode lines disposed at the bottom of each of the cells 161d, and the plurality of electrode lines may be configured to extend to neighboring cells.

The plurality of electrodes 161c are disposed below the cells 161d and applied with different polarities to generate an electric field in the cells 161d. In order to form the electric field, the dielectric layer may form the bottom of the cells 161d while the dielectric layer covers the plurality of electrodes 161c. In such a structure, when different polarities are applied to a pair of electrodes 161c from a lower side of each cell 161d, an electric field may be formed, and the semiconductor light-emitting element may be inserted into the cells 161d by the electric field.

At the assembly position, the electrodes of the substrate 161 are electrically connected to the power supply unit 171. The power supply unit 171 applies power to the plurality of electrodes to generate the electric field.

According to the illustration, the self-assembly device may include a magnet 163 for applying a magnetic force to the semiconductor light-emitting elements. The magnet 163 is spaced apart from the fluid chamber 162 to apply a magnetic force to the semiconductor light-emitting elements 150. The magnet 163 may be disposed to face an opposite side of the assembly surface of the substrate 161, and the location of the magnet is controlled by the location controller 164 connected to the magnet 163.

The semiconductor light-emitting element 1050 may have a magnetic body so as to move in the fluid by the magnetic field of the magnet 163.

Referring to FIG. 9, the semiconductor light-emitting element of the display device having a magnetic body may include a first conductive electrode 1052 and a second conductive electrode 1056, a first conductive semiconductor layer 1053 disposed with the first conductive electrode 1052, a second conductive semiconductor layer 1055 configured to overlap the first conductive semiconductor layer 1052, and disposed with the second conductive electrode 1056, and an active layer 1054 disposed between the first and second conductive semiconductor layers 1053, 1055.

Here, the first conductive type and the second conductive type may be composed of p-type and n-type, and vice versa. In addition, as described above, it may be a semiconductor light-emitting element without having the active layer.

Meanwhile, in the present disclosure, the first conductive electrode 1052 may be generated after the semiconductor light-emitting element is assembled to the wiring board by the self-assembly of the semiconductor light-emitting element. In addition, in the present disclosure, the second conductive electrode 1056 may include the magnetic body. The magnetic body may refer to a metal having magnetism. The magnetic body may be Ni, SmCo or the like, and for another example, a material corresponding to at least one of Gd-based, La-based, and Mn-based materials.

The magnetic body may be provided in the second conductive electrode 1056 in the form of particles. Furthermore, alternatively, for a conductive electrode including a magnetic body, a single layer of the conductive electrode may be made of a magnetic body. For such an example, as illustrated in FIG. 9, the second conductive electrode 1056 of the semiconductor light-emitting element 1050 may include a first layer 1056a and a second layer 1056b. Here, the first layer 1056a may be made to include a magnetic material, and the second layer 1056b may include a metal material other than the magnetic material.

As illustrated, in this example, the first layer 1056a including a magnetic body may be disposed to be in contact with the second conductive semiconductor layer 1055. In this case, the first layer 1056a is disposed between the second layer 1056b and the second conductive semiconductor layer 1055. The second layer 1056b may be a contact metal connected to the second electrode of the wiring substrate. However, the present disclosure is not necessarily limited thereto, and the magnetic body may be disposed on one surface of the first conductive semiconductor layer.

Referring again to FIGS. 6 and 7, more specifically, the self-assembly device may include a magnet handler that can be automatically or manually moved in the x, y, and z axes on the top of the fluid chamber or include a motor capable of rotating the magnet 163. The magnet handler and the motor may constitute the location controller 164. Through this, the magnet 163 rotates in a horizontal direction, a clockwise direction, or a counterclockwise direction with respect to the substrate 161.

On the other hand, a light transmitting bottom plate 166 may be formed in the fluid chamber 162, and the semiconductor light-emitting elements may be disposed between the bottom plate 166 and the substrate 161. An image sensor 167 may be positioned to view the bottom plate 166 so as to monitor an inside of the fluid chamber 162 through the bottom plate 166. The image sensor 167 is controlled by the controller 172, and may include an inverted type lens, a CCD, and the like to observe the assembly surface of the substrate 161.

The self-assembling apparatus described above is configured to use a combination of a magnetic field and an electric field, and using those fields, the semiconductor light-emitting elements may be placed at preset positions of the substrate by an electric field in the process of being moved by a location change of the magnet. Hereinafter, an assembly process using the self-assembly device described above will be described in more detail.

First, a plurality of semiconductor light-emitting elements 1050 having magnetic bodies are formed through the process described with reference to FIGS. 5A to 5C. In this case, a magnetic body may be deposited on the semiconductor light-emitting element in the process of forming the second conductive electrode in FIG. 5C.

Figure 8A:
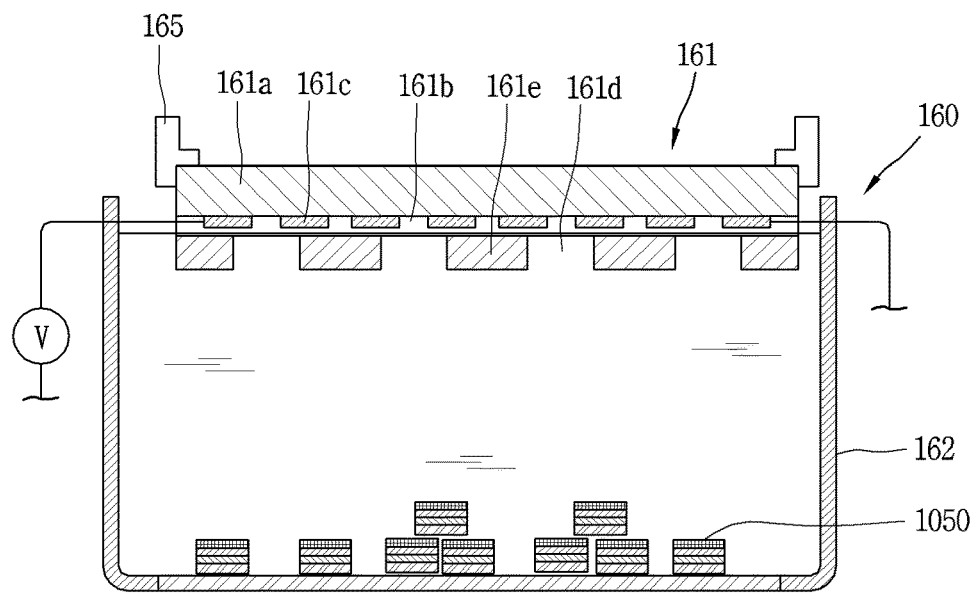
FIGS. 8A to 8E are conceptual views showing a step of self-assembling semiconductor light-emitting elements using the self-assembly device in FIG. 6.
Figure 9:
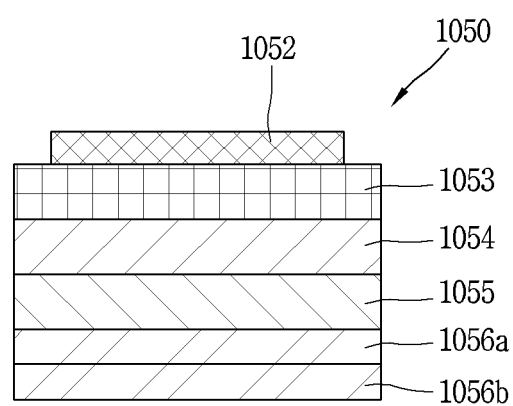
FIG. 9 is a conceptual view for explaining the semiconductor light-emitting element in FIGS. 8A to 8E.

Next, the substrate 161 is transferred to the assembly position, and the semiconductor light-emitting elements 1050 are placed into the fluid chamber 162 (FIG. 8A).

As described above, the assembly position of the substrate 161 is a position at which the assembly surface on which the semiconductor light-emitting elements 1050 of the substrate 161 are assembled is disposed in a downward direction in the fluid chamber 162.

In this case, some of the semiconductor light-emitting elements 1050 may sink to the bottom of the fluid chamber 162 and some may float in the fluid. When the light transmitting bottom plate 166 is provided in the fluid chamber 162, some of the semiconductor light-emitting devices 1050 may sink to the bottom plate 166.

Figure 8B:
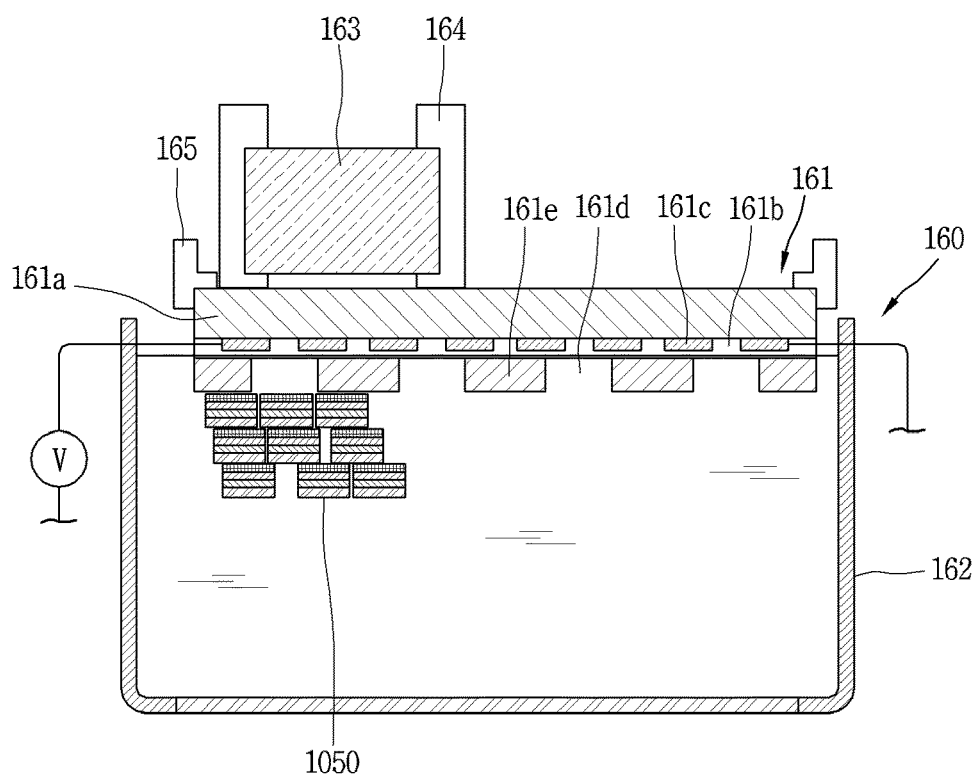

Next, a magnetic force is applied to the semiconductor light-emitting elements 1050 so that the semiconductor light-emitting elements 1050 float in the fluid chamber 162 in a vertical direction (FIG. 8B).

When the magnet 163 of the self-assembly device moves from its original position to an opposite side of the assembly surface of the substrate 161, the semiconductor light-emitting elements 1050 float in the fluid toward the substrate 161. The original position may be a position away from the fluid chamber 162. For another example, the magnet 163 may be composed of an electromagnet. In this case, electricity is supplied to the electromagnet to generate an initial magnetic force.

Meanwhile, in this example, a separation distance between the assembly surface of the substrate 161 and the semiconductor light-emitting elements 1050 may be controlled by adjusting the magnitude of the magnetic force. For example, the separation distance is controlled using the weight, buoyancy, and magnetic force of the semiconductor light-emitting elements 1050. The separation distance may be several millimeters to tens of micrometers from the outermost edge of the substrate.

Figure 8C:
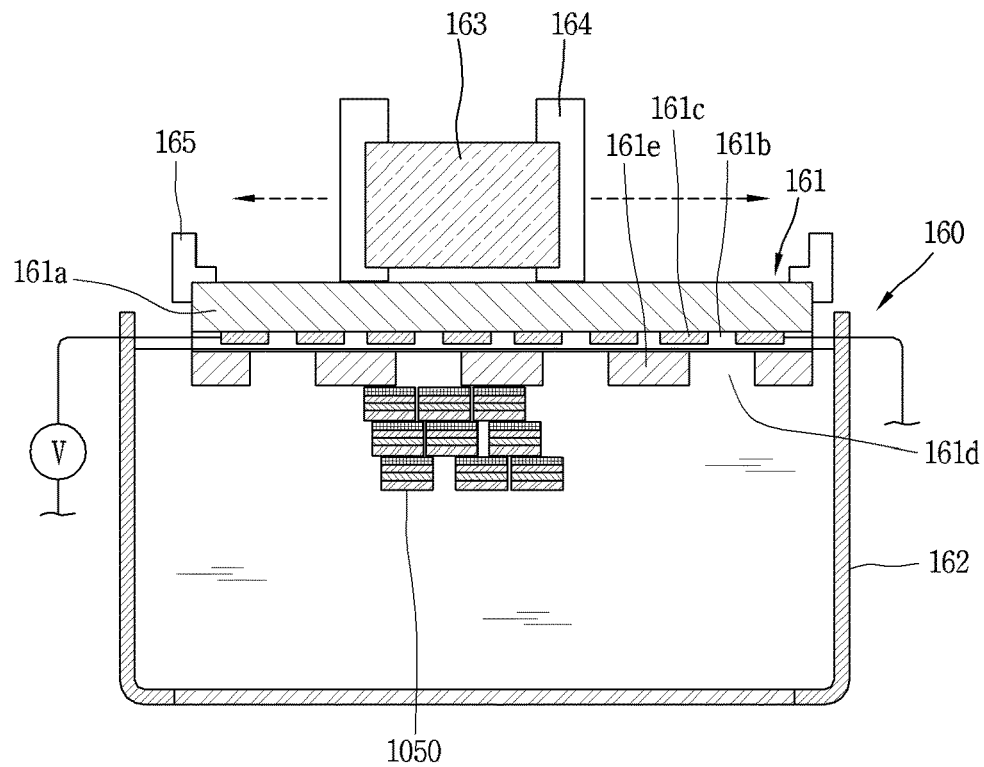

Next, a magnetic force is applied to the semiconductor light-emitting elements 1050 so that the semiconductor light-emitting elements 1050 move in one direction in the fluid chamber 162. For example, the magnet 163 moves in a horizontal direction, a clockwise direction or a counterclockwise direction with respect to the substrate (FIG. 8C). In this case, the semiconductor light-emitting elements 1050 move in a direction parallel to the substrate 161 at a position spaced apart from the substrate 161 by the magnetic force.

Next, the process of applying an electric field to guide the semiconductor light-emitting elements 1050 to preset positions of the substrate 161 so as to allow the semiconductor light-emitting elements 1050 to be placed at the preset positions during the movement of the semiconductor light-emitting elements 250 is carried out (FIG. 8C). For example, the semiconductor light-emitting elements 1050 move in a direction perpendicular to the substrate 161 by the electric field to be placed at preset positions of the substrate 161 while moving along a direction parallel to the substrate 161.

More specifically, electric power is supplied to a bi-planar electrode of the substrate 161 to generate an electric field to carry out assembly only at preset positions. In other words, the semiconductor light-emitting elements 1050 are assembled to the assembly position of the substrate 161 using a selectively generated electric field. For this purpose, the substrate 161 may include cells in which the semiconductor light-emitting elements 1050 are inserted.

Then, the unloading process of the substrate 161 is carried out, and the assembly process is completed. When the substrate 161 is an assembly substrate, a post-process of transferring the aligned semiconductor light-emitting elements to a wiring substrate as described above to implement a display device may be carried out.

Figure 8D:
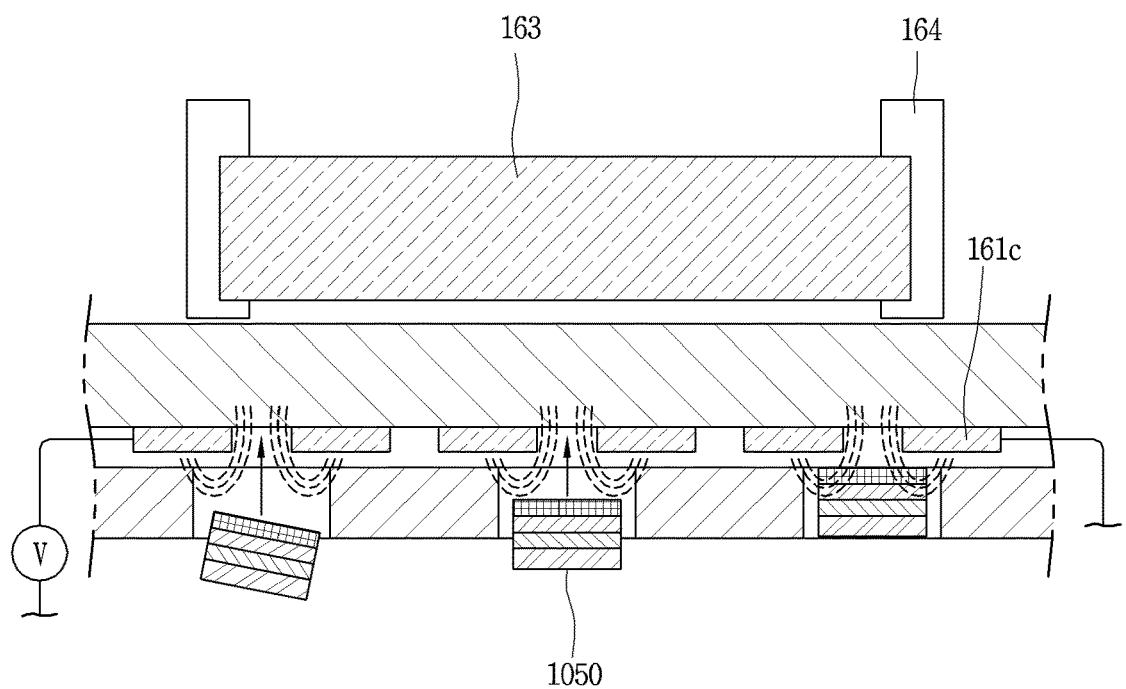
Figure 8E:
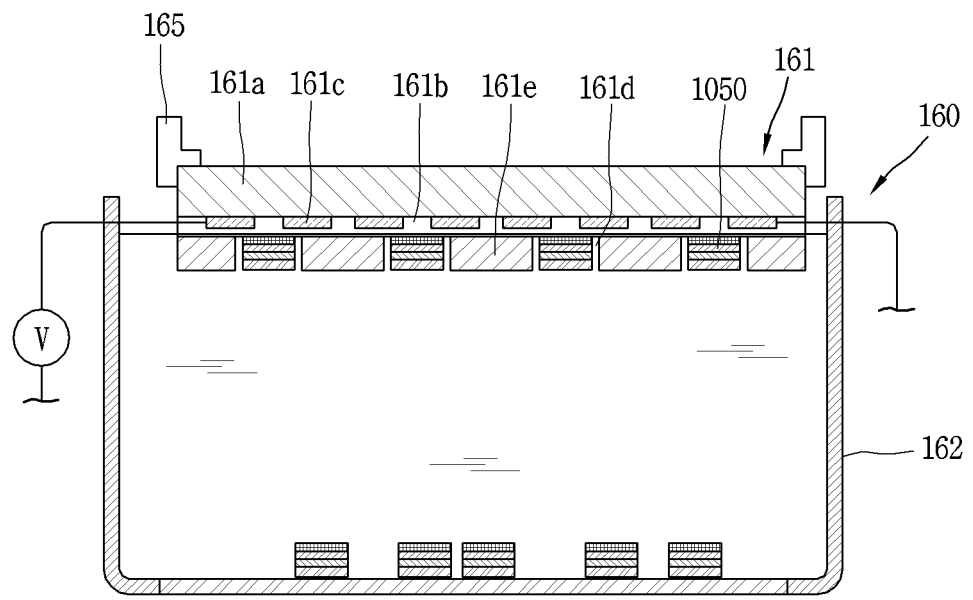

On the other hand, the semiconductor light-emitting elements 1050 may be guided to the preset positions, then the magnet 163 may move in a direction away from the substrate 161 such that the semiconductor light-emitting elements 1050 remaining in the fluid chambers 162 fall to the bottom of the fluid chambers 162, (FIG. 8D). For another example, if power supply is stopped when the magnet 163 is an electromagnet, then the semiconductor light-emitting elements 1050 remaining in the fluid chamber 162 fall to the bottom of the fluid chamber 162.

Then, when the semiconductor light-emitting elements 1050 on the bottom of the fluid chamber 162 are collected, the collected semiconductor light-emitting elements 1050 may be reused.

The above-described self-assembly device and method are characterized in that, in order to increase the assembly yield in a fluidic assembly, parts at a far distance are concentrated adjacent to a preset assembly site using a magnetic field, and a separate electric field is applied to the assembly site to selectively assemble the parts only in the assembly site. At this time, the assembly substrate is placed on an upper portion of the water tank and the assembly surface faces downward, thereby preventing nonspecific coupling while minimizing the effect of gravity due to the weight of parts. In other words, in order to increase the transfer yield, the assembly substrate is placed on the top to minimize the effect of a gravitational or frictional force, and prevent nonspecific coupling.

As described above, according to the present disclosure having the foregoing configuration, a large number of semiconductor light-emitting elements may be assembled at one time in a display device in which individual pixels are formed with semiconductor light-emitting elements.

As such, according to the present disclosure, a large number of semiconductor light-emitting elements may be pixelated on a wafer having a small size, and then transferred onto a large-area substrate. Through this, it may be possible to fabricate a large-area display device at a low cost.

Hereinafter, a display device using a semiconductor light-emitting element having a new structure according to an embodiment of the present disclosure and a manufacturing method therefor will be described.

The present disclosure presents a new structure for connecting a vertical semiconductor light-emitting element and a lower wiring of a substrate, and a method of forming such a structure.

Figure 10:
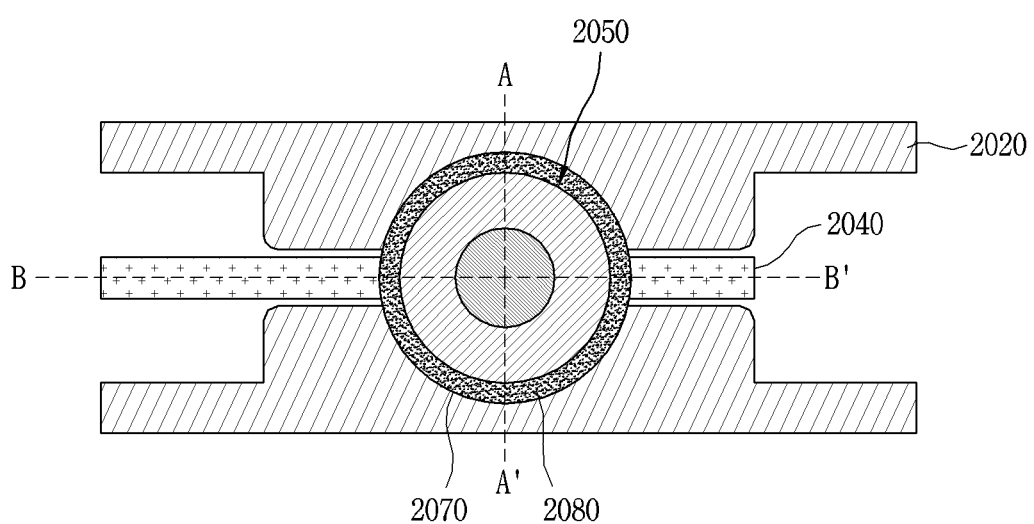
FIG. 10 is a conceptual view of a display device according to an embodiment of the present disclosure.
Figure 11A:
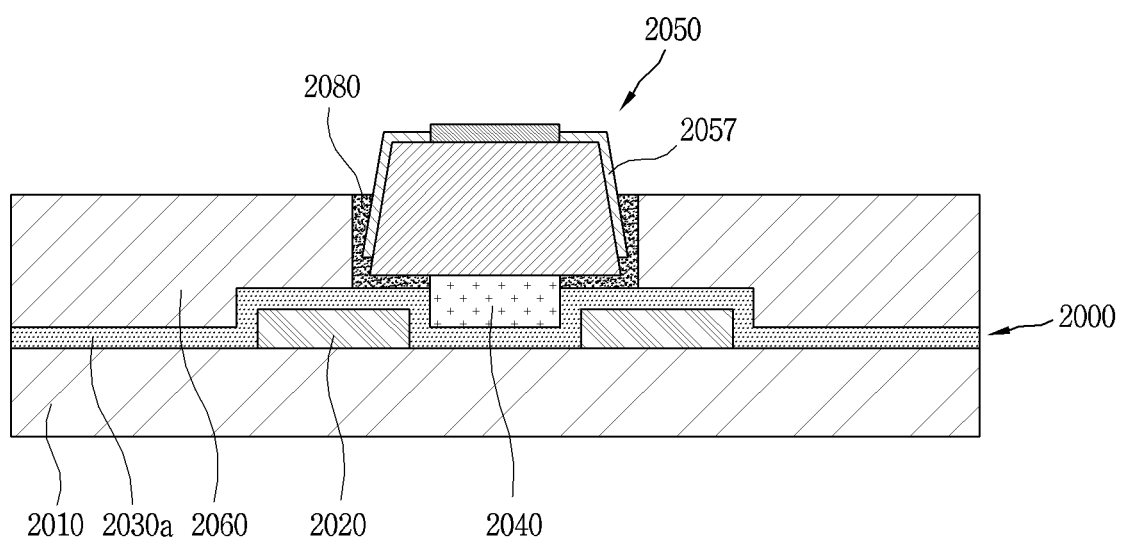
FIG. 11A is a cross-sectional view taken along line AA' in FIG. 10.
Figure 11B:
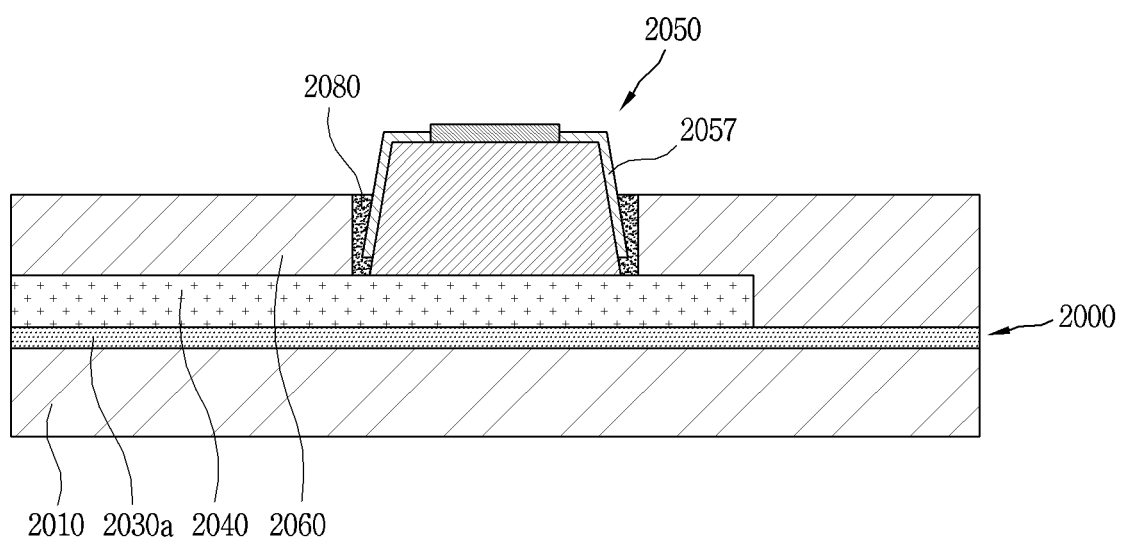
FIG. 11B is a cross-sectional view taken along line BB' in FIG. 10.

FIG. 10 is a conceptual view of a display device according to an embodiment of the present disclosure, FIG. 11A is a cross-sectional view taken along line AA' in FIG. 10, and FIG. 11B is a cross-sectional view taken along line BB' in FIG. 10.

According to an embodiment of the present disclosure, it is characterized in that a display device (hereinafter, referred to as a substrate or a final substrate) 2000 includes a solder layer 2080 in which a conductive material (e.g., metal) is filled inside a cell 2070 on which a semiconductor light-emitting element 2050 is mounted.

In an embodiment of the present disclosure, the substrate 2000 may include assembly electrodes 2020 for forming an electric field during self-assembly and wiring electrodes 2040, 2090 for driving the semiconductor light-emitting element 2050.

With regard to the substrate 2000, matters not described below may be replaced with the above-described descriptions of the substrate 161 in the related art.

First, lower assembly electrodes 2020 may extend in one direction, and may be disposed on a base portion 2010 at predetermined intervals. The assembly electrodes 2020 may be disposed in a plurality of lines.

The assembly electrodes 2020 may constitute a pair of pair electrodes between two adjacent assembly electrodes. Voltage signals having different polarities may be applied to the pair of pair electrodes, and thus an electric field may be formed between the pair electrodes. Moreover, the pair electrodes may overlap the cell 2070 to be described later to form an electric field in the cell 2070.

A dielectric layer 2030a may be deposited on the base portion 2010 to cover the assembly electrodes 2020. As shown in FIG. 11A, the dielectric layer 2030a may be deposited on the base portion 2010 according to the shape of the assembly electrode 2020, or deposited on the base portion 2010 while planarizing one surface of the base portion 2010 on which the assembly electrode 2020 is disposed.

A first wiring electrode 2040 extending in the same direction as the assembly electrode 2020 may be disposed on the dielectric layer 2030a. The first wiring electrode 2040 may be an electrode electrically connected to either one of two electrodes included in the semiconductor light-emitting element 2050 seated on the cell 2070 to be described later.

The first wiring electrode 2040 may be disposed in a region that does not overlap the assembly electrode 2020 on an entire region of the dielectric layer 2030a, thereby preventing a parasitic capacitance from being formed between the assembly electrode 2020 and the first wiring electrode 2040.

For example, the first wiring electrode 2040 may be disposed between the pair electrodes including two assembly electrodes 2020 adjacent to each other so as not to overlap the assembly electrodes 2020.

Meanwhile, a partition wall portion 2060 formed of an organic or inorganic insulating material may be deposited on the dielectric layer 2030a. The partition wall portion 2060 may be deposited on the dielectric layer 2030a while forming the cells 2070 at predetermined intervals along an extension direction of the assembly electrode 2020. The cell 2070 may be defined in the same shape as the semiconductor light-emitting element 2050, and may have a size somewhat larger than the semiconductor light-emitting element 2050 to allow the semiconductor light-emitting element 2050 to be seated therein.

The cell 2070 may overlap the assembly electrode 2020 and the first wiring electrode 2040.

The semiconductor light-emitting elements 2050 may be seated in the cell 2070. The semiconductor light-emitting elements 2050 may be guided and seated in the cell 2070 as the assembly electrode 2020 overlapping the cell 2070 forms an electric field, thereby being in contact with the first wiring electrode 2040 overlapping the cell 2070.

According to an embodiment of the present disclosure, the solder layer 2080 electrically connected to the first wiring electrode 2040 overlapping the cell 2070 while fixing the semiconductor light-emitting element 2050 seated in the cell 2070 may be filled into the cell 2070.

The solder layer 2080 may be formed of a conductive material, for example, a metal material, and for example, the solder layer 2080 may be formed of a low-melting-point metal that is melted at a much lower temperature than a metal material forming the assembly electrode 2020 and the wiring electrodes 2040, 2090.

For example, the solder layer 2080 may be formed of an element selected from Sn, In, Pb, Bi, Cd, and Zn, an element having a melting point similar thereto, or a compound of elements.

Meanwhile, for an effective electrical connection between the semiconductor light-emitting element 2050 and the first wiring electrode 2040, an empty space area inside the cell 2070 disposed with the solder layer 2080 may be enlarged to fill a larger amount of conductive material.

In an embodiment, the first wiring electrode 2040 may be disposed to protrude from a bottom surface of the cell 2070 than the dielectric layer 2030a. In this structure, an empty space may be defined between a bottom surface of the cell 2070 and the semiconductor light-emitting element 2050 seated in the cell 2070, and a conductive material forming the solder layer 2080 may be filled into the relevant space.

Meanwhile, although not shown in the drawings, even when the first wiring electrode 2040 is not disposed to protrude from the bottom surface of the cell 2070, the first wiring electrode 2040 and the semiconductor light-emitting element 2050 may be electrically connected by the solder layer 2080 filled onto a lateral inner surface of the cell 2070.

Figure 12:
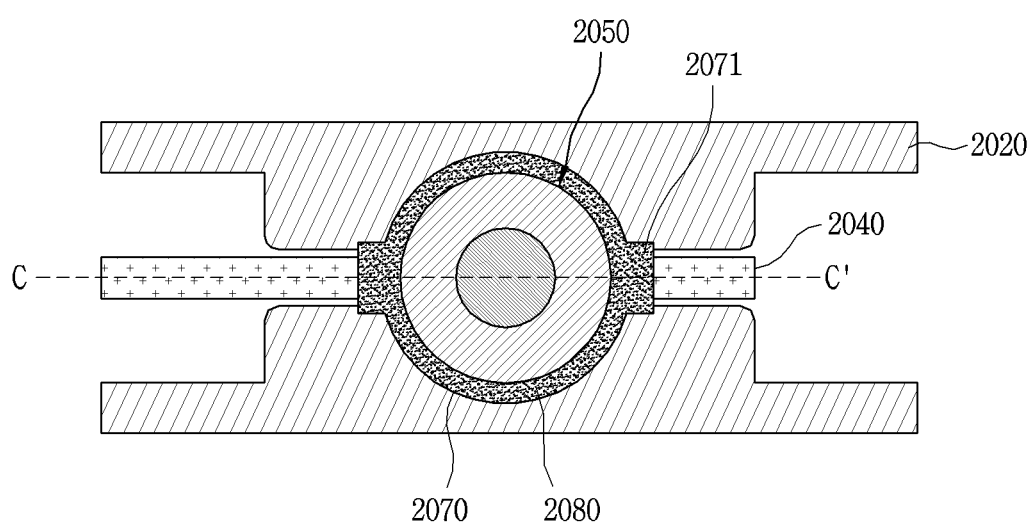
FIG. 12 is a conceptual view of a display device according to a further embodiment of the present disclosure.
Figure 13:
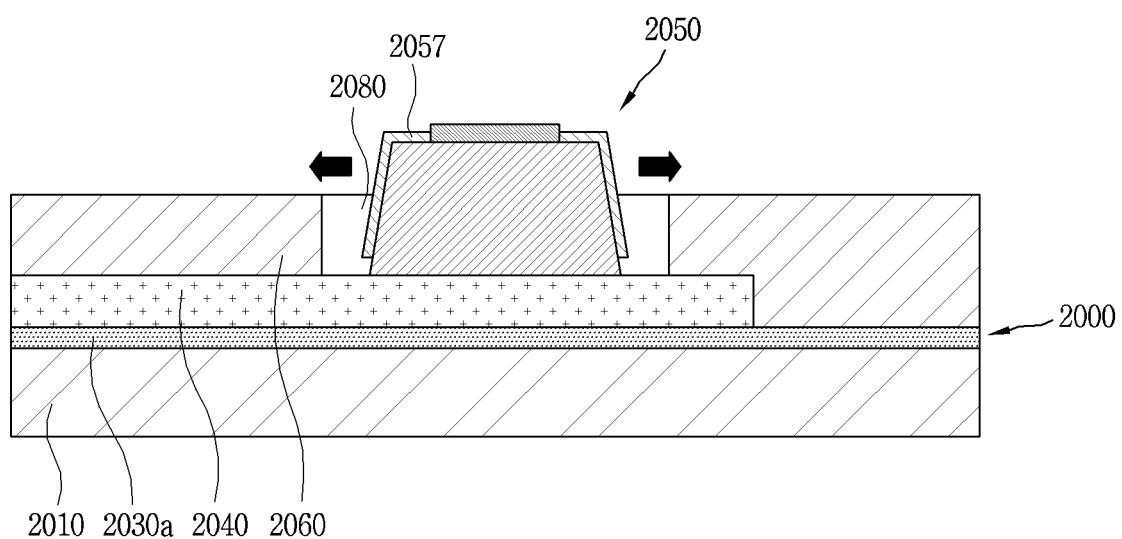
FIG. 13 is a cross-sectional view taken along line CC' in FIG. 12.

FIGS. 12 and 13 are views showing another embodiment for enlarging an area of the solder layer 2080. FIG. 12 is a conceptual view of a display device according to a further embodiment of the present disclosure, and FIG. 13 is a cross-sectional view taken along CC' in FIG. 12.

Referring to the drawings, the cell 2070 may further include a protruding portion 2071 protruding in an extension direction of the first wiring electrode 2040. As shown in FIG. 12, the protruding portions 2071 may be disposed on both sides or only on one side.

Furthermore, a width of the protruding portion 2071 may be the same as that of the first wiring electrode 2040 or may be disposed with a width larger than that of the first wiring electrode 2040. Such a structure maximizes an area of the first wiring electrode 2040 electrically connected to the semiconductor light-emitting element 2050 to sufficiently secure an amount of current supplied from the first wiring electrode 2040 to the semiconductor light-emitting element 2050.

Meanwhile, according to an embodiment of the present disclosure, the semiconductor light-emitting element 2050 seated in the cell 2070 may be a vertical semiconductor light-emitting element (see FIG. 9).

According to an embodiment of the present disclosure, the semiconductor light-emitting element 2050 may include a first conductive electrode, a first conductive semiconductor layer disposed on the first conductive electrode, an active layer disposed on the first conductive semiconductor layer, a second conductive semiconductor layer disposed on the active layer, and a second conductive electrode disposed on the second conductive semiconductor layer.

That is, the first conductive electrode and the second conductive electrode included in the semiconductor light-emitting element 2050 may be disposed to face different directions, and, therefore, either one of the electrodes may be connected to the wiring electrode at a lower portion thereof and the other electrode may be connected to the wiring electrode at an upper portion thereof. In this case, the upper and lower portions may be relative positions, and herein, the upper and lower portions are defined based on a deposition direction of the substrate 2000.

According to an embodiment of the present disclosure, either one of the first conductive electrode and the second conductive electrode of the semiconductor light-emitting element 2050 may be electrically connected to the first wiring electrode 2040 overlapping the cell 2070 at the lower portion.

In detail, the electrode of the semiconductor light-emitting element 2050 and the first wiring electrode 2040 may be electrically connected to each other by the solder layer 2080 filling into the cell 2070.

Meanwhile, as shown in the accompanying drawings, the solder layer 2080 formed of a conductive material may completely fill into an empty space existing inside the cell 2070 while the semiconductor light-emitting element 2050 is seated therein.

Accordingly, the semiconductor light-emitting element 2050 according to an embodiment of the present disclosure may further include a passivation layer 2057 covering at least part of a side surface of the semiconductor light-emitting element 2050 for electrical insulation from the solder layer 2080. The passivation layer 2057 may be formed of an insulating material.

For example, the passivation layer 2057 may be disposed on a side surface of the light emitting device 2050 to cover the remaining layers except for side surfaces of the first conductive electrode or the second conductive electrode of the semiconductor light-emitting element 2050 electrically connected to the first wiring electrode 2040, and may be disposed to extend to an upper surface thereof.

The passivation layer 2057 may electrically insulate layers through which a current flows in the semiconductor light-emitting element 2050 from the solder layer 2080.

Meanwhile, the second conductive electrode or the first conductive electrode of the semiconductor light-emitting element 2050 that is not connected to the first wiring electrode 2040 is electrically connected to the second wiring electrode 2090 above the partition wall portion 2060.

Figure 14:
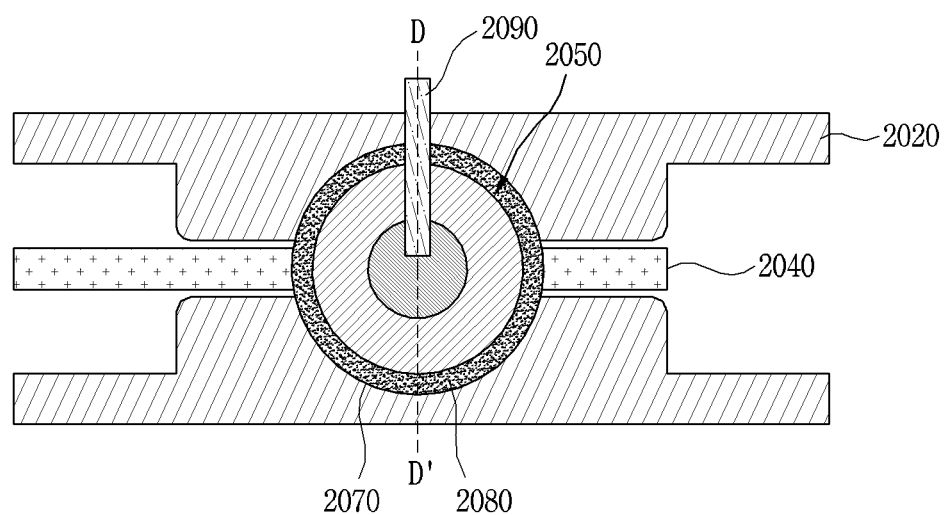
FIG. 14 is a conceptual view of a display device in which upper wiring is disposed according to an embodiment of the present disclosure.
Figure 15:
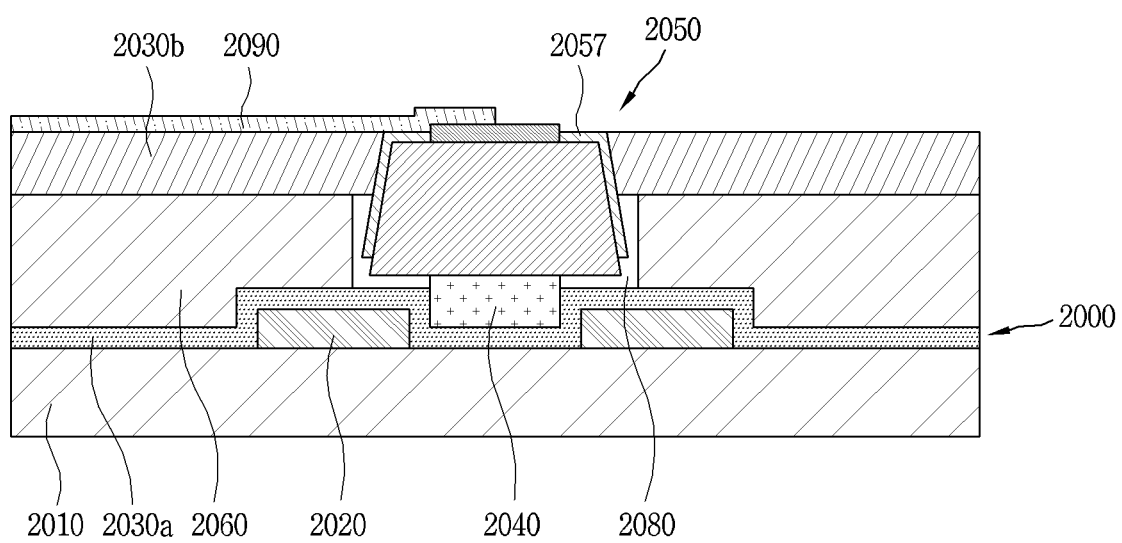
FIG. 15 is a cross-sectional view taken along line DD' in FIG. 14.
Figure 16A:
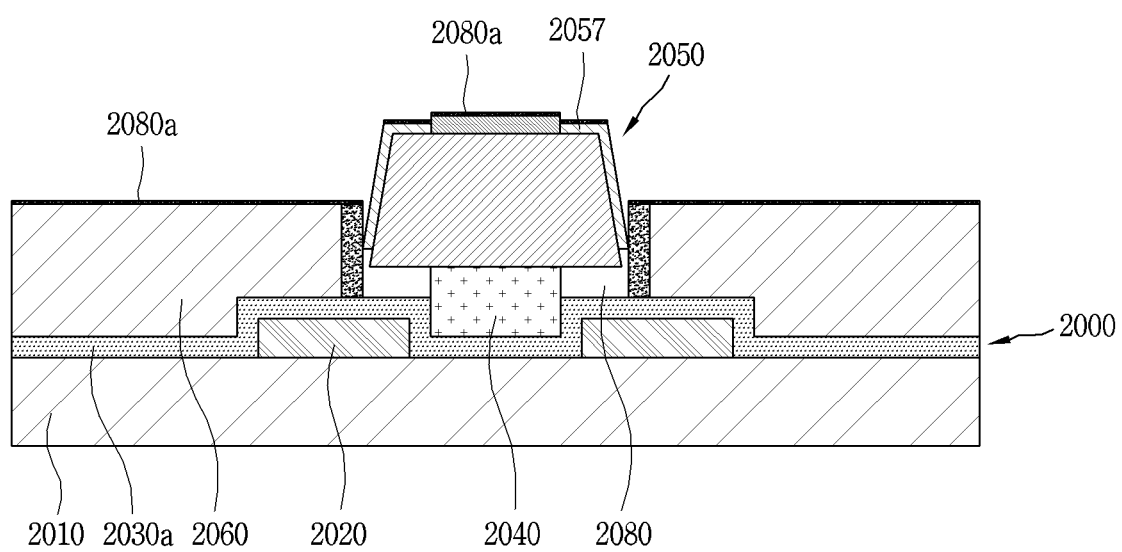
FIGS. 16A to 16D are views showing a process of forming a solder layer according to an embodiment of the present disclosure.
Figure 16B:
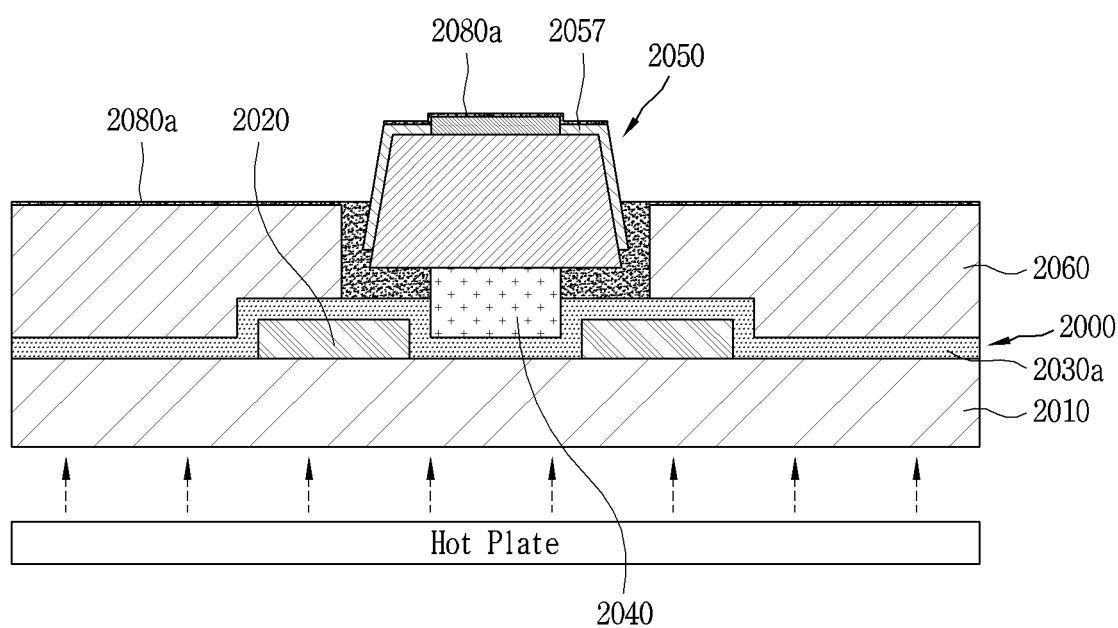
Figure 16C:
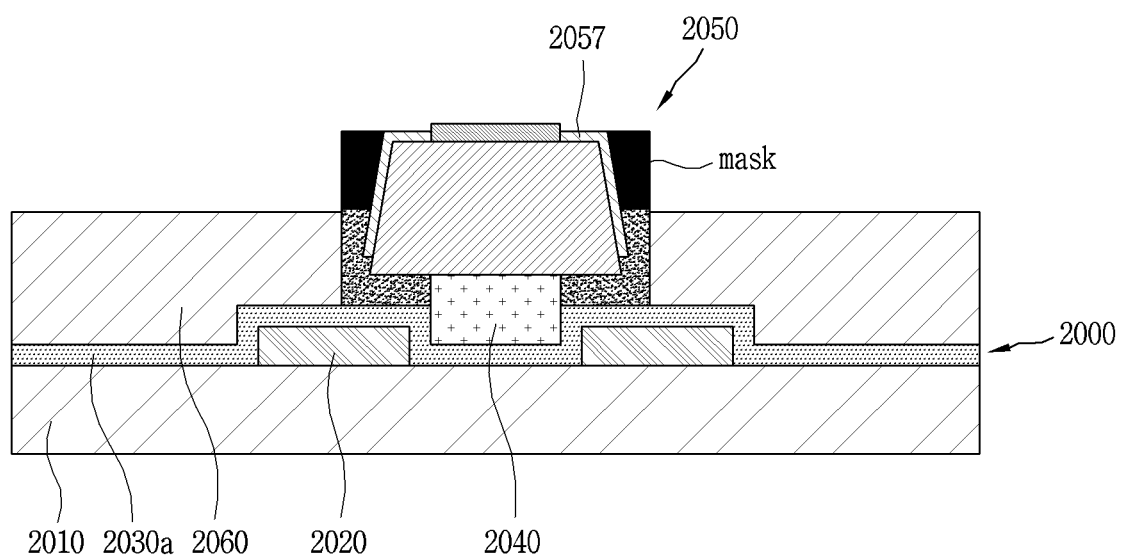
Figure 16D:
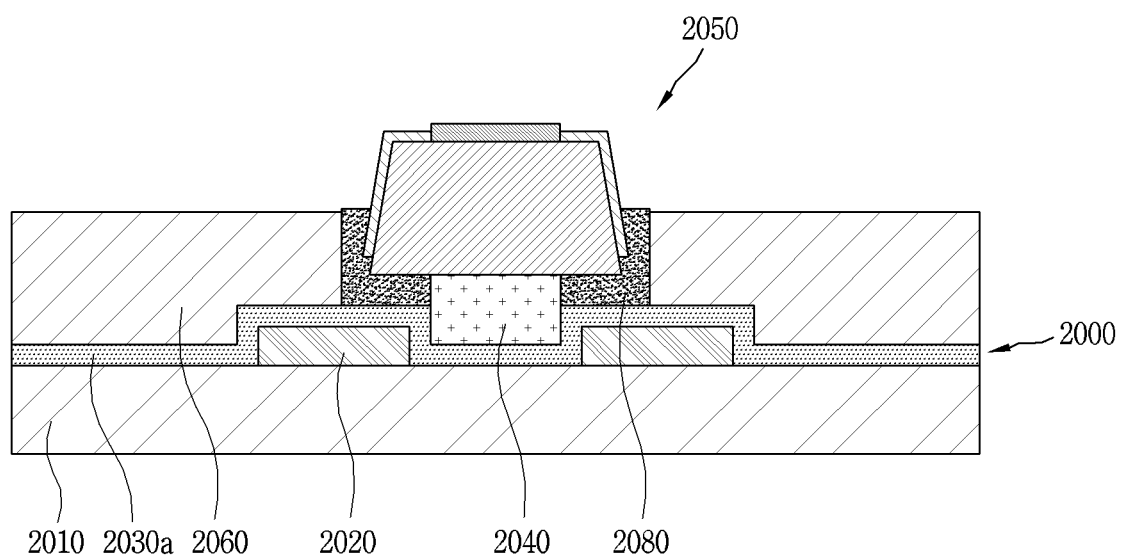

FIG. 14 is a conceptual view of a display device according to an embodiment of the present disclosure in which upper wiring disposed, and FIG. 15 is a cross-sectional view taken along DD' in FIG. 14.

The second wiring electrode 2090 may extend in a direction crossing the first wiring electrode 2040, and may be disposed on the partition wall portion 2060. A dielectric layer 2030*b* formed of the same or different insulating material as that of the partition wall 2060 may be further disposed on the partition wall portion 2060 as needed, and the second wiring electrode 2090 may be disposed on the dielectric layer 2030*b*.

Next, a method of manufacturing a display device having the above-described structure will be described.

First, arranging the assembly electrodes 2020 extending in one direction on the base part 2010 at predetermined intervals may be performed. For example, the assembly electrodes 2020 may be patterned on the base portion 2010 through a photolithography process.

Next, placing the dielectric layer 2030*a* on the base portion 2010 to cover the assembly electrodes 2020 may be performed. The dielectric layer 2030*a* may be formed of, for example, an insulating and dielectric inorganic material such as $SiO_2$ or $SiN_x$.

Next, placing the first wiring electrode 2040 extending in the same direction as the assembly electrodes 2020 on the dielectric layer 2030*a* may be performed. The first wiring electrode 2040 may also be patterned on the dielectric layer 2030*a* through a photolithography process, and may be disposed between the assembly electrodes 2020 so as not to overlap the assembly electrodes 2020.

Next, placing the partition wall portion 2060 to cover the dielectric layer 2030*a* while arranging the cells 2070 at predetermined intervals so as to overlap the assembly electrode 2020 and the first wiring electrode 2040 along an extension direction of the assembly electrode 2020 on the dielectric layer 2030*a*. The partition wall portion 2060 may be formed of an organic material (e.g., a photosensitive polymer) or an inorganic material (e.g., $SiO_2$, $SiN_x$, etc.), and may have a thickness of several to several tens of micrometers.

Next, seating the semiconductor light-emitting element 2050 in the cell 2070 may be performed. This step may be performed by a self-assembly method in which the semiconductor light-emitting elements 2050 are placed into a chamber containing a fluid and then seated in the cell 2070 using electric and magnetic fields. To this end, the semiconductor light-emitting elements 2050 may include a magnetic layer and may have a symmetrical structure.

Next, placing the solder layer 2080 into the cell 2070 may be performed. The solder layer 2080 may be a layer for electrically connecting the semiconductor light-emitting element 2050 seated in the cell 2070 and the first wiring electrode 2040 overlapping the cell 2070.

The placing of the solder layer 2080 may be performed in an empty space inside the cell 2070 after the semiconductor light-emitting element 2050 is seated in the cell 2070.

FIGS. 16A to 16D are views showing a process of forming a solder layer according to an embodiment of the present disclosure.

First, depositing of a metal having a melting point in a predetermined range may be performed on one surface of the partition wall portion 2060 on which the cell 2070 is disposed, and a thin metal layer may be disposed on one surface of the partition wall portion 2060 by the deposited metal.

In an embodiment, the metal may be deposited by vacuum sputtering, and may be deposited on one surface of the partition wall portion 2060, an upper surface of the semiconductor light-emitting element 2050, and an entire surface including an empty space inside the cell 2070.

Furthermore, the metal to be deposited may be, for example, a low-melting metal having a melting point of 500° C. or less, preferably, a melting point of 300° C. or less, and may be, for example, one or more elements selected from a group of In, Sn, Pb, Cd, Zn, and the like.

Next, heat-treating the deposited metal to be melted in a predetermined temperature range may be performed. For example, as a heat treatment in this step, a process (annealing) of heating to a temperature higher than the melting point of the deposited metal and then cooling may be performed.

As the metal deposited in this step is melted, the metal layer may be evenly formed on one surface of the partition wall portion 2060, and an empty space inside the cell 2070 may be filled.

Meanwhile, since the solder layer 2080 is formed of a low-melting-point metal material, the assembly electrode 2020 and the first wiring electrode 2040 may not be affected during the heating process.

Next, forming a mask on a region overlapping the empty space of the cell 2070, and then etching the deposited metal (or metal layer) may be performed. That is, the metal deposited on the region overlapping the empty space of the cell 2070 may not be removed in the etching step by the mask, and the metal deposited on the other region may be removed. For example, the metal layer on which the mask is not formed may be removed by plasma etching, but the present disclosure is not limited thereto.

Then, removing the formed mask may be performed, thereby manufacturing the substrate 2000 having a structure in which the empty space inside the cell 2070 is filled with a metal material. The metal layer filling into the empty space inside the cell 2070 may be the solder layer 2080, and the first conductive electrode or the second electrode of the semiconductor light-emitting element 2050 seated on the cell 2070 may be electrically connected to the first wiring electrode 2040 overlapping the cell 2070 by the solder layer 2080.

Furthermore, placing the second wiring electrode 2090 electrically connected to the second conductive electrode or the first conductive electrode of the semiconductor light-emitting element 2050 not electrically connected to the first wiring electrode 2040 may be further performed.

The second wiring electrode 2090 may be disposed to extend in a direction crossing the first wiring electrode 2040 on the partition wall portion 2060. The second wiring electrode 2090 may be disposed in the same manner as the first wiring electrode 2040.

In addition, prior to placing the second wiring electrode 2090, placing the dielectric layer 2030b on the partition wall portion 2060 as needed may be further performed.

As described above, in a display device according to an embodiment of the present disclosure, a lower electrode of the semiconductor light-emitting element 2050 and a lower wiring (first wiring electrode 2040) of the substrate may be electrically connected by the solder layer 2080 filling into the cell 2070, thereby having an effect capable of assembling the vertical semiconductor light-emitting element 2050 onto a final substrate by a self-assembly method. Also provided is a solder film 2080a on the partition wall portion 2060, for example.

In addition, according to an embodiment of the present disclosure, the cell 2070 may further include the protruding portion 2071 extending in an extension direction of the lower wiring (first wiring electrode 2040), and the solder layer 2080 may also be filled in the protruding portion 2071 to expand an area of the lower wiring (first wiring electrode 2040) electrically connected to the semiconductor light-emitting element 2050, thereby supplementing an amount of current supplied to the semiconductor light-emitting element 2050.

The present disclosure described above will not be limited to configurations and methods according to the above-described embodiments, and all or part of each embodiment may be selectively combined and configured to make various modifications thereto.

The invention claimed is:

1. A display device comprising:
   a base portion;
   assembly electrodes that extend in one direction and are disposed on the base portion at predetermined intervals;
   a dielectric layer deposited on the base portion to cover the assembly electrodes;
   a first wiring electrode that extends in the same direction as the assembly electrodes and is disposed on the dielectric layer so as not to overlap the assembly electrodes;
   a partition wall portion deposited on the dielectric layer while arranging cells at predetermined intervals to overlap the assembly electrodes and the first wiring electrode along an extension direction of the assembly electrodes; and
   semiconductor light-emitting elements seated in the cells, respectively,
   wherein a solder layer electrically connecting a semiconductor light-emitting element seated in a cell among the cells and the first wiring electrode overlapping the cell is filled in the cell,
   wherein the cell further comprises a protruding portion protruding in an extension direction of the first wiring electrode.

2. The display device of claim 1, wherein the semiconductor light-emitting element comprises:
   a first conductive electrode;
   a first conductive semiconductor layer disposed on the first conductive electrode;
   an active layer disposed on the first conductive semiconductor layer;
   a second conductive semiconductor layer disposed on the active layer; and
   a second conductive electrode disposed on the second conductive semiconductor layer,
   wherein the solder layer electrically connects either one of the first conductive electrode and the second conductive electrode of the semiconductor light-emitting element to the first wiring electrode.

3. The display device of claim 2, wherein the semiconductor light-emitting element further comprises a passivation layer covering at least part of a side surface of the semiconductor light-emitting element.

4. The display device of claim 1, wherein the protruding portion is disposed to have a width equal to or greater than that of the first wiring electrode.

5. The display device of claim 1, wherein the first wiring electrode is disposed to protrude further from a bottom surface of the cell than from the dielectric layer.

6. The display device of claim 2, further comprising:
a second wiring electrode that extends in a direction crossing the first wiring electrode and is disposed on the partition wall portion,
wherein the second wiring electrode is electrically connected to either one of the second conductive electrode and the first conductive electrode of the semiconductor light-emitting element.

7. A method of manufacturing a display device, the method comprising:
arranging assembly electrodes extending in one direction on a base portion of a substrate at predetermined intervals;
placing a dielectric layer on the base portion to cover the assembly electrodes;
placing a first wiring electrode extending in the same direction as the assembly electrodes on the dielectric layer;
placing a partition wall portion to cover the dielectric layer while arranging cells on the dielectric layer at predetermined intervals so as to overlap the assembly electrodes and the first wiring electrode along an extension direction of the assembly electrodes;
seating a semiconductor light-emitting element in a cell among the cells; and
placing a solder layer electrically connecting the semiconductor light-emitting element seated in the cell and the first wiring electrode overlapping the cell in the cell,
wherein the cell further comprises a protruding portion protruding in an extension direction of the first wiring electrode.

8. The method of claim 7, wherein the solder layer is disposed in an empty space of the cell in which the semiconductor light-emitting element is seated, and
wherein the placing a solder layer electrically connecting the semiconductor light-emitting element seated in the cell and the first wiring electrode overlapping the cell in the cell comprises:
depositing a metal having a melting point in a predetermined range on one surface of the partition wall portion on which the cell is disposed;
heat-treating the deposited metal to be melted in the predetermined temperature range;
placing a mask on an area overlapping the empty space of the cell and then etching the deposited metal; and
removing the placed mask.

9. The method of claim 7, further comprising:
placing a second wiring electrode extending in a direction crossing the first wiring electrode on the partition wall portion.

10. The method of claim 7, wherein the seating of the semiconductor light-emitting element in the cell includes placing the semiconductor light-emitting element in a chamber containing a fluid and then seating the semiconductor light-emitting element in the cell using electric and magnetic fields.

11. The method of claim 7, wherein the first wiring electrode is placed on a region of the dielectric layer that does not overlap the assembly electrodes in a thickness direction of the substrate.

12. The method of claim 11, wherein the dielectric layer is interposed between the first wiring electrode and the assembly electrodes.

13. The display device of claim 1, wherein the first wiring electrode does not overlap the assembly electrodes in a thickness direction of the substrate.

14. The display device of claim 1, wherein the dielectric layer is interposed between the first wiring electrode and the assembly electrodes.

15. A method of manufacturing a display device, the method comprising:
arranging assembly electrodes extending in one direction on a base portion of a substrate at predetermined intervals;
placing a dielectric layer on the base portion to cover the assembly electrodes;
placing a first wiring electrode extending in the same direction as the assembly electrodes on the dielectric layer;
placing a partition wall portion to cover the dielectric layer while arranging cells on the dielectric layer at predetermined intervals so as to overlap the assembly electrodes and the first wiring electrode along an extension direction of the assembly electrodes;
seating a semiconductor light-emitting element in a cell among the cells; and
placing a solder layer electrically connecting the semiconductor light-emitting element seated in the cell and the first wiring electrode overlapping the cell in the cell,
wherein the solder layer is disposed in an empty space of the cell in which the semiconductor light-emitting element is seated, and
wherein the placing a solder layer electrically connecting the semiconductor light-emitting element seated in the cell and the first wiring electrode overlapping the cell in the cell comprises:
depositing a metal having a melting point in a predetermined range on one surface of the partition wall portion on which the cell is disposed;
heat-treating the deposited metal to be melted in the predetermined temperature range;
placing a mask on an area overlapping the empty space of the cell and then etching the deposited metal; and
removing the placed mask.

\* \* \* \* \*